(12) United States Patent
Kamm

(10) Patent No.: US 7,166,393 B2
(45) Date of Patent: Jan. 23, 2007

(54) REFLECTION MASK FOR PROJECTING A STRUCTURE ONTO A SEMICONDUCTOR WAFER AND METHOD FOR PRODUCING THE MASK

(75) Inventor: Frank-Michael Kamm, Unterhaching (DE)

(73) Assignee: Infineon Technologies AG, Munich (DE)

( * ) Notice: Subject to any disclaimer, the term of this patent is extended or adjusted under 35 U.S.C. 154(b) by 179 days.

(21) Appl. No.: 10/723,631

(22) Filed: Nov. 26, 2003

(65) Prior Publication Data

US 2004/0106051 A1    Jun. 3, 2004

(30) Foreign Application Priority Data

Nov. 28, 2002    (DE) ............................... 102 55 605

(51) Int. Cl.
    *G01F 9/00*    (2006.01)
(52) U.S. Cl. ..................................................... 430/5
(58) Field of Classification Search .................... 430/5, 430/30, 394; 378/35
    See application file for complete search history.

(56) References Cited

U.S. PATENT DOCUMENTS

| 6,180,291 | B1 * | 1/2001 | Bessy et al. ................... 430/5 |
| 6,352,803 | B1 | 3/2002 | Tong et al. |
| 6,888,621 | B2 * | 5/2005 | Araki et al. .................. 355/75 |
| 2004/0067420 | A1 * | 4/2004 | Ota ............................... 430/5 |

* cited by examiner

*Primary Examiner*—S. Rosasco
(74) *Attorney, Agent, or Firm*—Laurence A. Greenberg; Werner H. Stemer; Ralph E. Locher

(57) ABSTRACT

A reflection mask for projecting a structure onto a semiconductor wafer contains a carrier material, a layer stack for reflecting obliquely incident light and formed of an alternating sequence of reflective layers disposed on a front side of the carrier material, and a light-absorbing layer. In the light-absorbing layer at least one opening is formed as the structure to be projected and which is disposed on the alternating layer stack. An electrically conductive layer is buried within the carrier material near a surface of a rear side of the carrier material. The buried electrically conductive layer is produced by ion implantation preferably in a whole-area manner on the rear side of the mask. The depth and the depth extent of the layer are controlled by the ion energy and also the dose.

11 Claims, 1 Drawing Sheet

REFLECTION MASK FOR PROJECTING A STRUCTURE ONTO A SEMICONDUCTOR WAFER AND METHOD FOR PRODUCING THE MASK

BACKGROUND OF THE INVENTION

Field of the Invention

The invention relates to a reflection mask for projecting a structure onto a semiconductor wafer and to a method for producing the mask. The invention relates, in particular, to a reflection mask that can be chucked to a substrate holder to which an electrostatic potential is applied, so that a process can be implemented on structures that are formed on a front side of the reflection mask.

For the purpose of projecting structures onto substrates such as semiconductor wafers or flat panels, use is made of light with a wavelength that is progressively being reduced in order to improve the resolution. Wavelengths used at the present time are 193 nm and 248 nm.

The structures to be formed on the substrate are usually projected from a mask into a photosensitive layer on the substrate. For the light with the wavelengths used at the present time, use is made of so-called transmission masks, in which structures are formed as openings in a light-absorbing layer on a transparent carrier material. With the progressive reduction of the wavelengths, the hitherto transparent carrier material, for example quartz, becomes opaque to light below 157 nm, with the result that so-called reflection masks must be worked with in the future. The reflection masks contain a carrier material that, on account of the extreme radiation conditions of short-wave light, is formed of a so-called low thermal expansion material (LTEM). This has a very low coefficient of thermal expansion and can thus be used particularly advantageously for achieving high positional accuracies in the various processes.

So-called multilayers, i.e. layer stacks with alternating sequences of thin reflection layers, are usually formed on the carrier material. The alternating sequence of layers contains, by way of example, molybdenum and silicon layers alternately. The reflection of light that has been radiated in is based on the principle of distributed Bragg reflection. In this case, the period of the multilayers is adapted to the exposure wavelength. The thickness of the individual layers in the layer stack is a few nanometers.

In a manner similar to that in the case of transmission masks, structures that are to be imaged by a projection onto the substrate are defined by light-absorbing layers disposed on the reflective layer stack.

On account of the very small structure widths which are to be achieved on the substrate, there is an increase in the requirements imposed particularly also on the evenness of the surfaces of the reflection masks. The reason is that the light beam, which is necessarily incident obliquely in order to achieve the reflection, in the case of an unevenness representing a vertical deviation, leads to a horizontal displacement of a relevant structure in the image plane.

In order to avoid the formation of such unevennesses in particular as a result of bending while carrying out a process, for instance the projection of structures onto a substrate, it is necessary, therefore, to ensure a whole-area chucking of the rear side of the carrier material of the reflection mask on a substrate holder. Such substrate holders (chucks) have a high degree of evenness, with the result that the corresponding bending is considerably reduced.

The chucking could be realized by a suction device generating a vacuum. The exposure units have to operate in a vacuum, however, at the exposure wavelengths envisaged, in particular the extreme ultraviolet wavelength range (10–15 nm) and also in the case of electron beam writers. Therefore, the use of a substrate holder operating according to the principle of electrostatic attraction is planned. Such a type of substrate holder requires a conductive layer, which has hitherto been disposed on the rear side of the insulating carrier material of the reflection mask as a counter electrode for the electric field built up by the substrate holder. In this case, an electrostatic potential is applied to the substrate holder.

For this purpose, metallic or other conductive layers have hitherto been applied on the rear side of the carrier material, i.e. the side opposite to the front side covered with the reflective and the absorbent layer, by sputtering or other deposition methods.

In this case, a particular problem consists in the adhesion of the metallic or other conductive layers on the carrier material under the action of the suction or chucking forces due to the substrate holder. As a result of contact or friction, loosened particles are thereby liberated from the rear side and can have a contaminating effect in subsequent processes. The generation of particles is particularly intensive if materials of different hardness or stiffness are used for the metallic or other conductive layer and for the surface of the substrate holder. A low thermal expansion material (LTEM) similar to the carrier material of the reflection masks is usually used as material for the substrate holder.

SUMMARY OF THE INVENTION

It is accordingly an object of the invention to provide a reflection mask for projecting a structure onto a semiconductor wafer and a method for producing the mask that overcome the above-mentioned disadvantages of the prior art devices and methods of this general type, with which the quality of the exposure process of substrates such as semiconductor wafers or flat panels is considerably improved. In particular, it is an object of the present invention to reduce the particle contamination during and after the chucking of reflection masks to a substrate holder in an exposure process.

With the foregoing and other objects in view there is provided, in accordance with the invention, a reflection mask for projecting a structure onto a semiconductor wafer. The reflection mask contains a carrier material having a front side and a rear side with a surface, and a layer stack for reflecting obliquely incident light and containing an alternating sequence of reflective layers formed on the front side of the carrier material. A light-absorbing layer having at least one opening formed therein as the structure to be projected is disposed on the alternating sequence of reflective layers. An electrically conductive layer is buried within the carrier material near the surface of the rear side of the carrier material.

The electrically conductive layer is formed e.g. by ion implantation as a buried layer in the carrier material—which is electrically insulating without further action—of a reflection mask or the mask blank thereof as a precursor substrate. The doping of the carrier material has the effect of forming, in accordance with the established profile of the concentration of dopant atoms or molecules, a counter electrode for an externally applied electric field, such counter electrode lying near the surface of the rear side.

The externally applied field is provided for example by a substrate holder to which an electrostatic potential is applied. The electric field built up by the substrate holder effects a redistribution of charge carriers within the electrically conductive layer in such a way as to effect a force of attraction between the electrode formed by the substrate holder and the counter electrode in the buried layer. The mask blank or the reflection mask is chucked to the substrate holder on account of the attraction.

Application of a further layer that, chemically, differs considerably from the carrier material does not take place on the rear side. The composition of the carrier material essentially remains unchanged. Only a proportionally low incorporation of impurity atoms takes place. Since the electrically conductive layer is buried, in particular the material composition at the surface of the carrier material on the rear side of the reflection mask essentially remains unchanged.

The carrier material of the reflection mask ideally corresponds to the material contained in the substrate holder, so that only very little particle erosion takes place in the case of contact between the mask and the holder. The materials have the same stiffness, as a result of which the generation of particles at the rear side is advantageously reduced. A further advantage is that there is no thin rear-side coating with metal layers that might adhere to the surface of the substrate holder on account of the strong forces of attraction.

A further advantage is that a roughening of the surface of the rear side of the carrier material takes place as a result of the implantation, thereby reducing the adhesion of the rear side on account of static friction. This behavior is particularly favorable for the removal of the mask from the substrate holder (dechucking). Otherwise, particularly planar and smooth surfaces of mask and substrate holder would stick to one another due to so-called bonding effects.

The present invention does not preclude a concentration of dopant atoms also being present at the surface of the rear side of the carrier material. An essential feature is that the carrier material is essentially preserved at the surface of the rear side of the mask. The deeper burying of the electrically conductive layer affords particular advantages, however, since the in any case quantitatively low proportion of dopant atoms at the surface of the rear side is reduced further. As a result, it is possible, by way of example, to reduce reactions with gas atoms in further processes to be carried out.

With the foregoing and other objects in view there is further provided, in accordance with the invention, a method for producing the reflection mask. The method includes providing a mask blank formed of an electrically insulating carrier material, a layer stack for reflecting obliquely incident light, the layer stack having an alternating sequence of reflective layers formed on a front side of the carrier material, and a light-absorbing layer disposed on the layer stack. The carrier material is doped with ions on a rear side of the mask blank for forming a buried electrically conductive layer in the carrier material. Openings are formed as structures in the light-absorbing layer on a front side of the mask blank.

The present invention likewise encompasses the formation of buried electrically conductive layers by an analogous processes for forming a doped carrier material, for example a superficial treatment of the rear side with a temporary intermediate layer and subsequent outdiffusion into the carrier material. In a further step, the surface can be freed again of the temporary intermediate layer. By further processes, it is readily possible for the superficial concentration of dopant atoms to be reduced again, thereby producing a buried electrically conductive layer.

Substances that can be used for the implantation are all materials which can be used e.g. in the doping of semiconductor material and with which an electrical conductivity is produced. These are, in particular, gallium, aluminum, molecular hydrogen, boron, and arsenic. Also conceivable are, inter alia, iron, gold, copper, etc.

Other features which are considered as characteristic for the invention are set forth in the appended claims.

Although the invention is illustrated and described herein as embodied in a reflection mask for projecting a structure onto a semiconductor wafer and a method for producing the mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
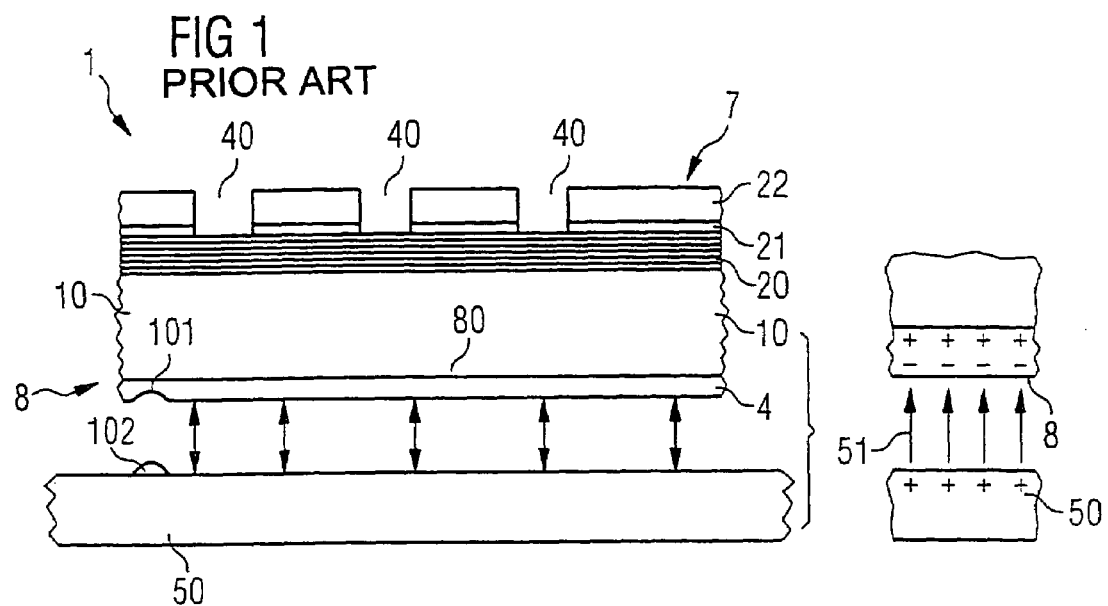
FIG. 1 is a diagrammatic, sectional view of a reflection mask with a rear-side electrically conductive layer in accordance with the prior art.

Referring now to the figures of the drawing in detail and first, particularly, to FIG. 1 thereof, there is shown, in order to provide a better understanding of the problems in the chucking of reflection masks in accordance with the prior art, a cross-sectional profile of an EUV reflection mask known to the average person skilled in the art. The abbreviation EUV is used for the extreme ultraviolet wavelength range and in this case designates an interval of 10 nm to 15 nm, for example. The invention can be used particularly advantageously in this wavelength range, as is shown further below.

The EUV reflection mask 1 contains a carrier material 10, which is formed from a low thermal expansion material (LTEM), for example the product Zerodur from the company Schott or the product ULE from the company Corning.

A front side 7 and a rear side 8 are defined in order to produce such an EUV reflection mask. A layer stack 20 containing an alternating sequence of thin layers containing molybdenum and silicon is formed on the front side 7. A buffer layer 21 is deposited on the layer stack 20, the buffer layer 21 serving to protect the layer stack 20 during an etching operation for forming structures 40 in an absorber layer 22 disposed on the buffer layer 21.

A metallic layer 4 is applied on a surface 80 on the rear side 8 of the carrier material 10. As can be seen on the right in FIG. 1, it serves as a counter electrode for an electric field 51 applied by a substrate holder 50 functioning as a first electrode.

The illustration on the left in FIG. 1 shows how parts 101 from the metallic layer 4 can break off when making contact with the substrate holder 50 and be left behind as contaminating particle deposits 102.

Figure 2:
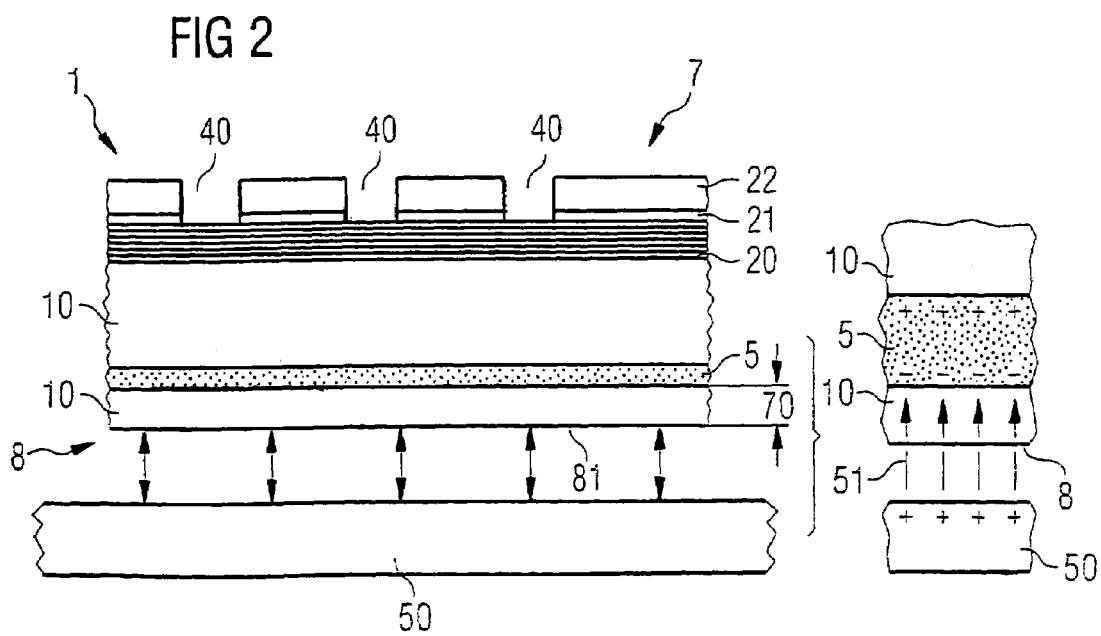
FIG. 2 is a diagrammatic, sectional view of the reflection mask with a rear-side buried electrically conductive layer in accordance with an exemplary embodiment of the invention.

An exemplary embodiment of the invention is shown in FIG. 2. On the rear side 8 of the carrier material 10 of the EUV reflection mask 1, a buried electrically conductive layer 5 is disposed within the carrier material 10 at a depth 70. The depth 70 is significantly smaller than the thickness of the carrier material 10, so that the buried layer is situated near a surface 81 of the carrier material 10 on the rear side 8 thereof.

The buried electrically conductive layer 5 shown in FIG. 2 is achieved by an ion implantation of gallium ions, for example.

It goes without saying that gallium ions are distributed, with albeit low probabilities, over a wide depth range of the carrier material. The dotted area shown in FIG. 2 merely represents a depth range in the carrier material 10 in which the course of the profile of the concentration of doping atoms, i.e. gallium ions, has a maximum. The depth range, which is only illustrated diagrammatically, reflects for example that region in which the concentration is still within an order of magnitude of the maximum value of the dopant concentration.

What is essential is that a layer-like segment, which dopants have made sufficiently conductive, is present in the otherwise insulating carrier material 10, so that it is possible to achieve a charge carrier concentration under the influence of an external electric field. For this purpose, in the exemplary embodiment, the dopant concentration rises from the surface 81 in the direction toward greater depths on the rear side 8, reaches a maximum value and then falls again toward even greater depths in the carrier material 10.

In the depth range in which the maximum value is reached, a conductive layer having an effective thickness is produced as a result of the implantation. For the maximum value of the dopant concentration, a depth of 250 nm results for gallium ions accelerated with 30 keV, a depth of 2 μm results for boron ions accelerated with 30 keV, and a depth of 480 nm results for phosphorus ions accelerated with 30 keV. A depth of 560 nm results for boron ions implanted with only 10 keV. Effective thicknesses of the electrically conductive layers typically amount to orders of magnitude of 10 nm, in which case particularly narrow distributions can be achieved in the case of a phosphorus implantation. Typical dopant concentrations are an order of magnitude of $10^{16}$ atoms per cubic centimeter.

In an exemplary production method, the ion implantation can advantageously be controlled, so that the electrically conductive buried layer has the desired depth (absolute) and depth extent. The corresponding doping profile is set by the ion energy and also the dose for the ion beam. The depth extent is chosen in such a way that an effective charge separation can be effected by the field. The absolute depth is limited by a maximum distance from the substrate holder or the surface thereof, so that the electric field just suffices to enable a force of attraction which presses the reflection mask onto the substrate holder and thus outweighs bending stresses.

It is clear to the competent person skilled in the art that the present invention can also be applied to other areas in which substrates with a carrier material containing insulating substances are to be chucked to a substrate holder. The corresponding embodiments are concomitantly included by the present invention. These may be transmission masks, semiconductor wafers, flat panels, compact disks, etc. and other flat disk-type objects.

I claim:

1. A reflection mask for projecting a structure onto a semiconductor wafer, comprising:
    a carrier material having a front side and a rear side with a surface;
    a layer stack for reflecting obliquely incident light and containing an alternating sequence of reflective layers formed on said front side of said carrier material;
    a light-absorbing layer having at least one opening formed therein as the structure to be projected and disposed on said alternating sequence of reflective layers; and
    an electrically conductive layer buried within said carrier material near said surface of said rear side of said carrier material.

2. The reflection mask according to claim 1, wherein said electrically conductive layer has a concentration of dopant atoms which are disposed within said carrier material.

3. The reflection mask according to claim 1, wherein said carrier material contains at least one material from a group of low thermal expansion materials.

4. The reflection mask according to claim 1, wherein said electrically conductive layer contains at least one element selected from the group consisting of gallium, aluminum, molecular hydrogen, boron, arsenic, and phosphorus.

5. The reflection mask according to claim 1, wherein said electrically conductive layer is formed in whole-area fashion near said surface on said rear side of said carrier material.

6. A method for producing a reflection mask, which comprises the steps of:
    providing a mask blank formed of an electrically insulating carrier material, a layer stack for reflecting obliquely incident light, the layer stack having an alternating sequence of reflective layers formed on a front side of the carrier material, and a light-absorbing layer disposed on the layer stack;
    doping the carrier material with ions on a rear side of the mask blank for forming a buried electrically conductive layer in the carrier material; and
    forming openings as structures in the light-absorbing layer on a front side of the mask blank for further forming the reflection mask.

7. The method according to claim 6, which further comprises carrying out the doping step by ion beam implantation.

8. The method according to claim 6, which further comprises carrying out the doping step by applying a further layer containing the ions and a subsequent outdiffusion of the ions into the carrier material.

9. The method according to claim 6, which further comprises carrying out the doping in a whole-area manner on a rear side of the carrier material.

10. A method for chucking masks to a substrate holder, which comprises the steps of:
    providing a reflection mask containing a carrier material having a front side and a rear side with a surface, a layer stack for reflecting obliquely incident light and containing an alternating sequence of reflective layers formed on the front side of the carrier material, a light-absorbing layer having at least one opening formed therein as a structure to be projected and disposed on the alternating sequence of reflective layers, and an electrically conductive layer buried within the carrier material near the surface of the rear side of the carrier material; and
    applying an electrostatic potential to the substrate holder.

11. The method according to claim 10, which further comprises forming the substrate holder from a material substantially corresponding to the carrier material of the reflection mask.

* * * * *